United States Patent
Chang et al.

(10) Patent No.: US 10,910,267 B2
(45) Date of Patent: *Feb. 2, 2021

(54) ALIGNMENT MARKS IN SUBSTRATE HAVING THROUGH-SUBSTRATE VIA (TSV)

(71) Applicant: Taiwan Semiconductor Manufacturing Co., Ltd., Hsinchu (TW)

(72) Inventors: Hsin Chang, Hsinchu (TW); Fang Wen Tsai, Hsinchu (TW); Jing-Cheng Lin, Hsinchu (TW); Wen-Chih Chiou, Zhunan Township (TW); Shin-Puu Jeng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/908,348

(22) Filed: Jun. 22, 2020

(65) Prior Publication Data

US 2020/0321249 A1 Oct. 8, 2020

Related U.S. Application Data

(63) Continuation of application No. 16/227,752, filed on Dec. 20, 2018, now Pat. No. 10,692,764, which is a (Continued)

(51) Int. Cl.
*H01L 21/768* (2006.01)
*H01L 23/544* (2006.01)
(Continued)

(52) U.S. Cl.
CPC .... *H01L 21/76898* (2013.01); *H01L 21/6835* (2013.01); *H01L 23/481* (2013.01); *H01L 23/544* (2013.01); *H01L 24/03* (2013.01); *H01L 24/11* (2013.01); *H01L 23/49827* (2013.01); *H01L 24/05* (2013.01); *H01L 24/13* (2013.01); *H01L 2221/6834* (2013.01); *H01L 2221/68327* (2013.01); *H01L 2221/68381* (2013.01); *H01L 2223/5442* (2013.01); *H01L 2223/54426* (2013.01); *H01L 2224/03002* (2013.01); *H01L 2224/03912* (2013.01); *H01L 2224/0401* (2013.01); *H01L 2224/05166* (2013.01); *H01L 2224/05181* (2013.01); *H01L 2224/05187* (2013.01); *H01L 2224/05647* (2013.01); *H01L 2224/11002* (2013.01);
(Continued)

(58) Field of Classification Search
None
See application file for complete search history.

(56) References Cited

U.S. PATENT DOCUMENTS 5,391,917 A 2/1995 Gilmour et al.
5,510,298 A 4/1996 Redwine
(Continued)

FOREIGN PATENT DOCUMENTS

CN 1649148 8/2005
JP 2009277719 A 11/2009

*Primary Examiner* — Ali Naraghi
(74) *Attorney, Agent, or Firm* — Slater Matsil, LLP

(57) ABSTRACT

A device includes a substrate, and an alignment mark including a conductive through-substrate via (TSV) penetrating through the substrate.

20 Claims, 9 Drawing Sheets

Related U.S. Application Data continuation of application No. 14/586,276, filed on Dec. 30, 2014, now Pat. No. 10,163,706, which is a continuation of application No. 12/874,952, filed on Sep. 2, 2010, now Pat. No. 8,928,159.

(51) Int. Cl.
*H01L 23/00* (2006.01)
*H01L 21/683* (2006.01)
*H01L 23/48* (2006.01)
*H01L 23/498* (2006.01)

(52) U.S. Cl.
CPC .............. *H01L 2224/1146* (2013.01); *H01L 2224/1147* (2013.01); *H01L 2924/0105* (2013.01); *H01L 2924/01023* (2013.01); *H01L 2924/01029* (2013.01); *H01L 2924/01033* (2013.01); *H01L 2924/01073* (2013.01); *H01L 2924/01074* (2013.01); *H01L 2924/01077* (2013.01); *H01L 2924/01327* (2013.01); *H01L 2924/14* (2013.01)

(56) References Cited

U.S. PATENT DOCUMENTS

| | | | |
|---|---|---|---|
| 5,767,001 A | 6/1998 | Bertagnolli et al. | |
| 5,998,292 A | 12/1999 | Black et al. | |
| 6,087,719 A | 7/2000 | Tsunashima | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,469 B2 | 1/2005 | Sawada et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2* | 5/2006 | Savastiouk | H01L 23/13 438/106 |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,161,231 B2 | 1/2007 | Koike | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 8,017,439 B2 | 9/2011 | Takahashi et al. | |
| 8,089,161 B2 | 1/2012 | Komuro | |
| 8,102,064 B2* | 1/2012 | Renn | H01L 23/544 257/797 |
| 8,227,295 B2 | 7/2012 | Simmons-Matthews et al. | |
| 8,440,554 B1* | 5/2013 | Hiner | H01L 23/481 438/584 |
| 8,928,159 B2 | 1/2015 | Chang et al. | |
| 10,163,706 B2* | 12/2018 | Chang | H01L 21/6835 |
| 2008/0090308 A1 | 4/2008 | Noda et al. | |
| 2010/0078770 A1 | 4/2010 | Purushothaman et al. | |
| 2010/0171226 A1* | 7/2010 | West | H01L 23/481 257/774 |
| 2010/0224876 A1 | 9/2010 | Zhu | |
| 2011/0095435 A1 | 4/2011 | Volant et al. | |
| 2011/0170266 A1 | 7/2011 | Haensch et al. | |
| 2011/0198721 A1 | 8/2011 | Yang et al. | |
| 2019/0131172 A1 | 5/2019 | Chang et al. | |

* cited by examiner

US 10,910,267 B2

ALIGNMENT MARKS IN SUBSTRATE HAVING THROUGH-SUBSTRATE VIA (TSV)

PRIORITY CLAIM AND CROSS-REFERENCE

This application is a continuation of U.S. patent application Ser. No. 16/227,752, filed on Dec. 20, 2018, which is a continuation of U.S. patent application Ser. No. 14/586,276, filed on Dec. 30, 2014, now U.S. Pat. No. 10,163,706, issued on Dec. 25, 2018, which application is a continuation of U.S. patent application Ser. No. 12/874,952, entitled "Alignment Marks in Substrate Having Through-Substrate Via (TSV)," filed on Sep. 2, 2010, now U.S. Pat. No. 8,928,159 issued on Jan. 6, 2015, which applications are incorporated herein by reference.

BACKGROUND

In order to form three-dimensional (3D) integrated circuit structures, through-substrate vias (TSVs) are used to electrically couple front-side features to the backside features of a wafer. On the front side, there may be interconnect structures and metal bumps, for example. On the backside, there may be metal bumps and redistribution lines. Dual-side alignment needs to be performed in order to accurately align the backside features and the front-side features with each other.

Typically, the front-side features are formed on the wafer first, followed by a backside grinding to thin a silicon substrate in the wafer, until the TSVs are exposed. Front-side alignment marks are incorporated in the front-side features. The dual-side alignment is performed from the backside using an infra-red (IR) alignment system for locating the front-side alignment marks, wherein the infra-red light emitted by the IR alignment system penetrates through the thinned silicon substrate to reach the front-side alignment marks. Backside alignment marks are then made on the backside of the wafers by etching into the backside layer(s) and into the silicon substrate.

Due to the limitation of the IR alignment system, and further due to the thickness variation in the grinded silicon substrate, the accuracy of the dual-side alignment is low, and the misalignment may be as high as about 2 µm.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel dual-side alignment mark and methods of forming the same are provided in accordance with an embodiment. The intermediate stages of manufacturing the dual-side alignment marks are illustrated in accordance with an embodiment. The variations of the embodiments are then discussed. Throughout the various views and illustrative embodiments, like reference numbers are used to designate like elements.

Figure 1:
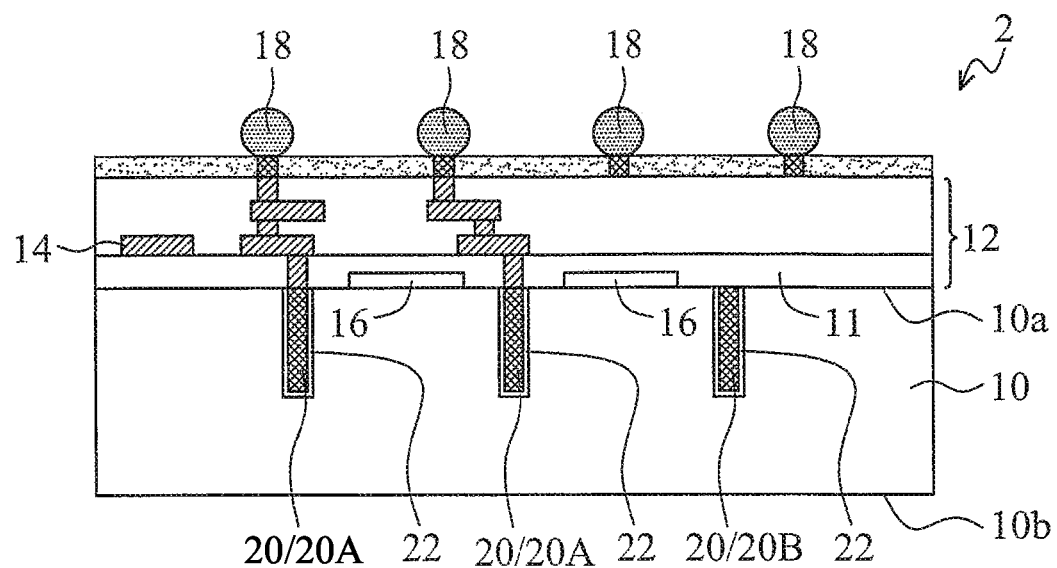
FIGS. 1 through 7 are cross-sectional views of intermediate stages in the manufacturing and using of alignment marks in accordance with an embodiment.

Referring to FIG. 1, wafer 2, which includes substrate 10, is provided. In an embodiment, substrate 10 is a semiconductor substrate, such as a bulk silicon substrate, although it may include other semiconductor materials such as group III, group IV, and/or group V elements. Integrated circuit devices 16, which may include transistors, may be formed at front surface 10a of substrate 10. In alternative embodiments, wafer 2 is an interposer or a package substrate, which may not include active devices such as transistors therein. However, passive devices such as transistors and capacitors may be included in wafer 2. Substrate 10 thus may be formed of a semiconductor material such as silicon or formed of a dielectric material. Interconnect structure 12 including metal lines and vias formed therein is formed over substrate 10, and may be electrically coupled to the integrated circuit devices. The metal lines and vias may be formed of copper or copper alloys, and may be formed using the well-known damascene processes. Interconnect structure 12 may include commonly known inter-layer dielectric (ILD) 11 and inter-metal dielectrics (IMDs), which are formed over ILD 11.

Figure 8:
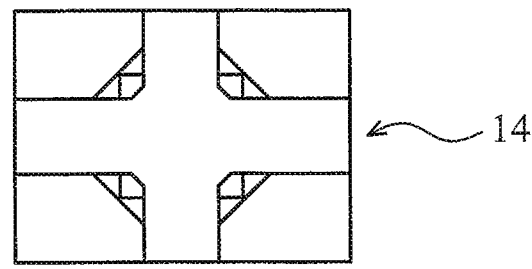
FIG. 8 illustrates a top view of a front-side alignment mark.

Alignment mark 14 is formed on the front side of substrate 10, and may be formed, for example, in the first-level metal layer (the bottom IMD layer), although it may be formed in other-level metal layers. A top view of an exemplary alignment mark 14 is illustrated in FIG. 8. Alignment mark 14 may have different shapes other than what is shown in FIG. 8.

Through-substrate vias (TSVs) 20 are formed in substrate 10, and extend from front surface 10a of substrate 10 into substrate 10. Depending on whether TSVs 20 are formed using a via-first approach or a via-last approach, TSVs 20 may extend into ILD 11 that is used to cover the active devices, but not into the IMD layers in interconnect structure 12. Alternatively, TSVs 20 may penetrate through both substrate 10, ILD 11, and possibly interconnect structure 12. Isolation layers 22 are formed on the sidewalls of TSVs 20, and electrically insulate the respective TSVs 20 from substrate 10. Isolation layers 22 may be formed of commonly used dielectric materials such as silicon nitride, silicon oxide (for example, tetra-ethyl-ortho-silicate (TEOS) oxide), and the like.

TSVs 20 include functional TSVs 20A and alignment-mark TSVs 20B. Although only one alignment-mark TSV 20B is illustrated, there may be a plurality of alignment-mark TSVs 20B, as illustrated in FIGS. 9A through 9G and FIGS. 11A through 11D. Functional TSVs 20A may be used to electrically couple the conductive features on the front side of substrate 10 to the conductive features on the backside of substrate 10. Alignment-mark TSVs 20B are used for aligning the features on the backside to the features on the front side of wafer 2. Alignment-mark TSVs 20B and alignment mark 14 are aligned to each other. In an embodiment, functional TSVs 20A and alignment-mark TSVs 20B are formed simultaneously. In alternative embodiments, functional TSVs 20A and alignment-mark TSVs 20B are formed at different times by separate formation processes. Further, functional TSVs 20A may have a same diameter, a same pitch, and/or a same height as alignment-mark TSVs 20B. Alternatively, the diameter, the pitch, and/or the height of functional TSVs 20A may be different from that of alignment-mark TSVs 20B. Metal bumps 18 may then be formed on the front side of wafer 2.

Figure 2:
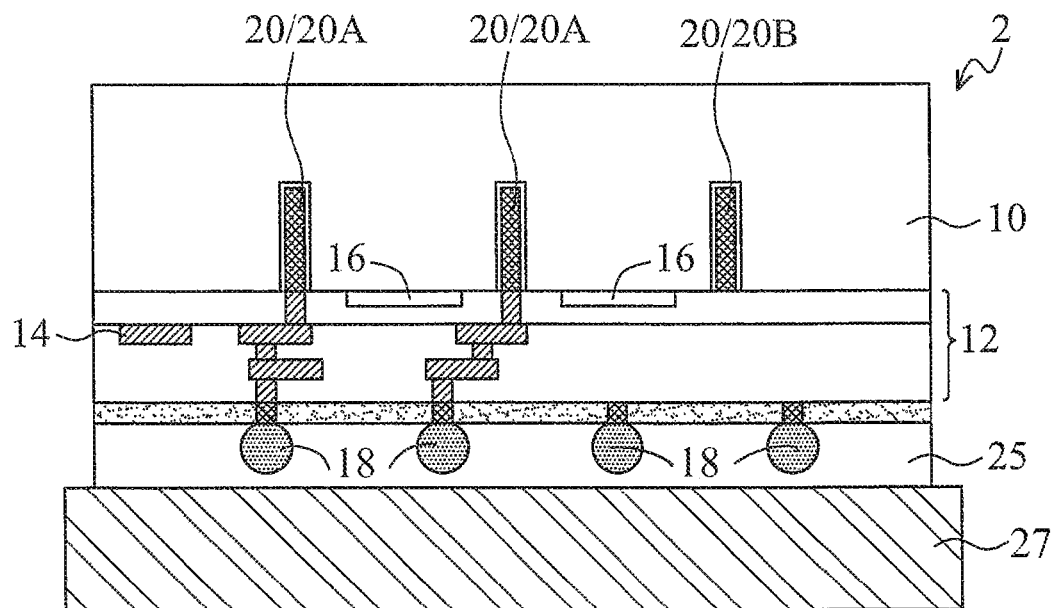
Figure 3:
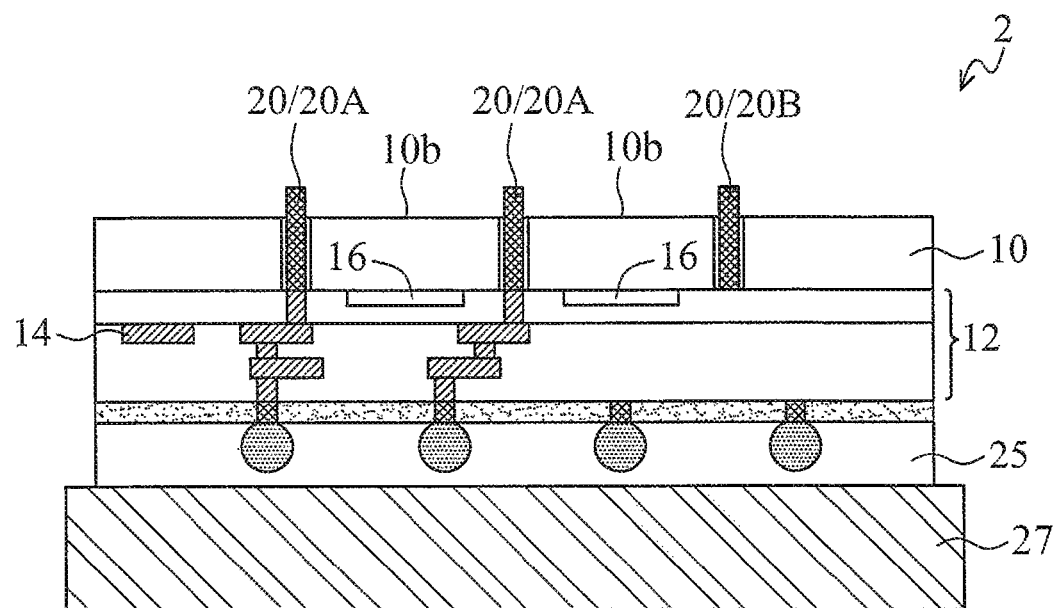

Referring to FIG. 2, wafer 2 is bonded to carrier 27, for example, through adhesive 25, which may be ultra-violet (UV) glue. Next, as shown in FIG. 3, a backside grinding is performed to remove excess portions of substrate 10. An etch may further be performed to lower back surface 10b of substrate 10, so that TSVs 20 protrude above back surface 10b.

Figure 4:
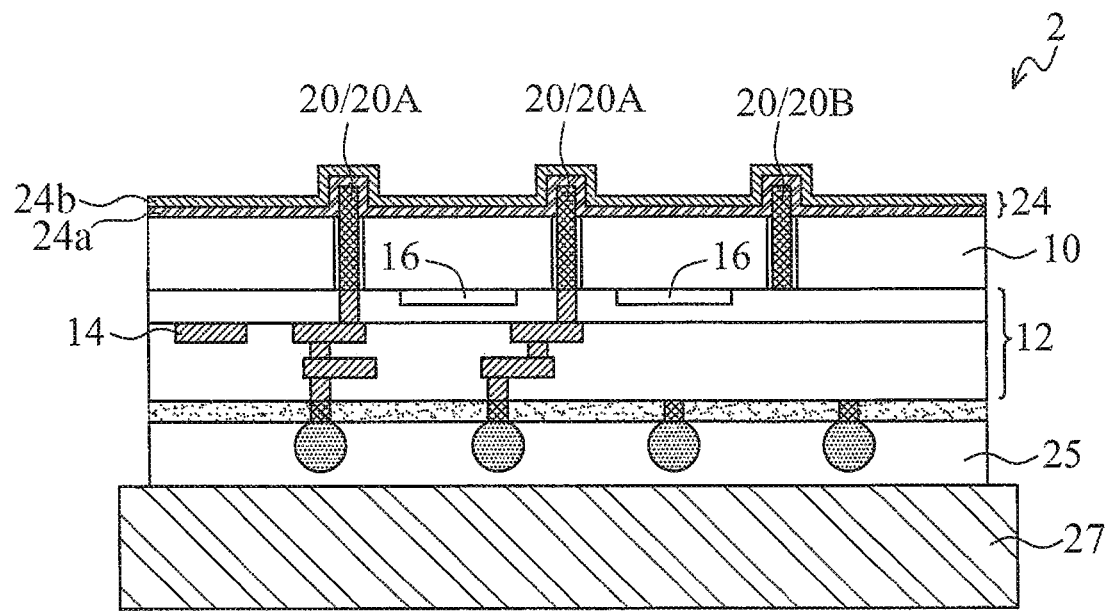

In FIG. 4, passivation layer 24 is formed to cover back surface 10b of substrate 10 and TSVs 20. In an exemplary embodiment, passivation layer 24 includes silicon nitride layer 24a and silicon oxynitride layer 24b over silicon nitride layer 24a, although passivation layer 24 may be formed different materials and/or have different structures.

Figure 5:
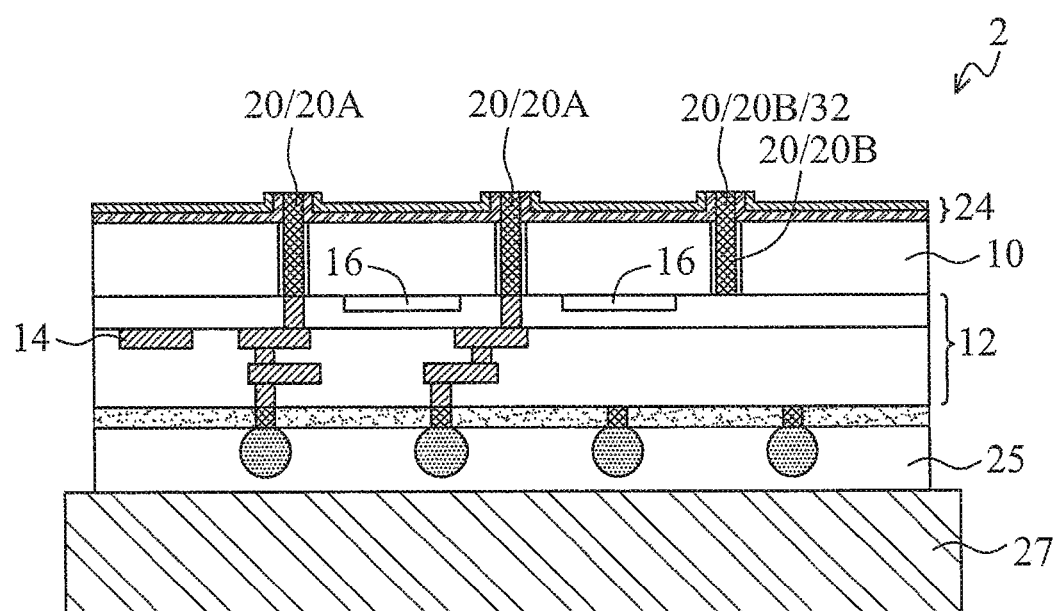

Next, using a patterned photo resist, portions of passivation layer 24 are etched, and the ends of TSVs 20 (including functional TSVs 20A and alignment-mark TSVs 20B) are exposed. The patterned photo resist is then removed, resulted in a structure shown in FIG. 5. The exposed alignment-mark TSVs 20B may thus be used as alignment mark 32, which are used for the alignment in the formation of backside features such as redistribution lines (RDLs) and/or metal bumps, so that the backside features on the backside of wafer 2 may be accurately aligned to desirable positions, and aligned to front-side alignment mark 14.

Figure 6:
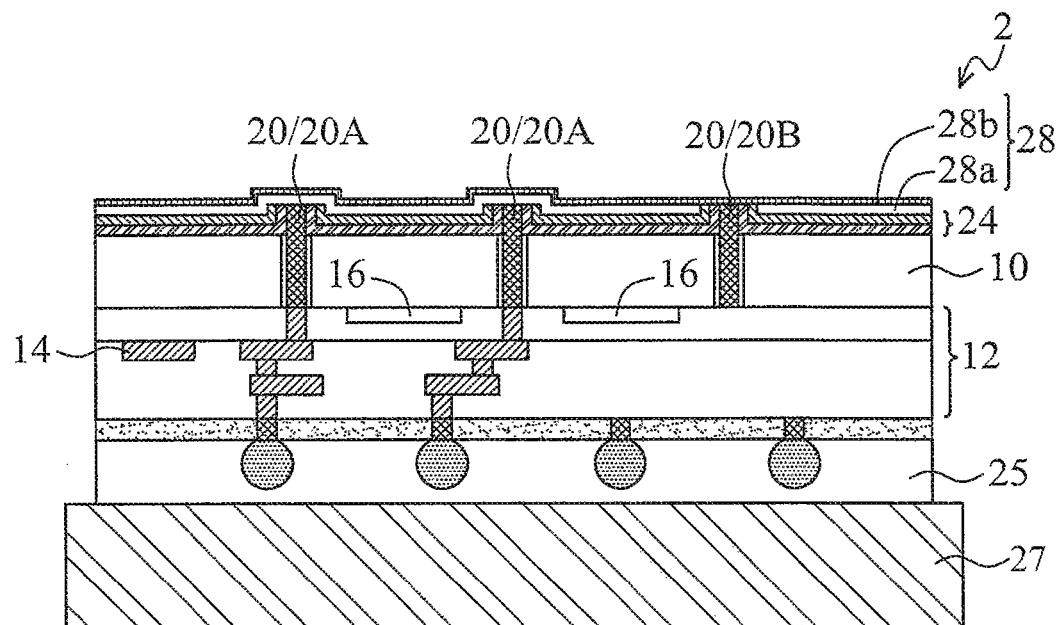

FIG. 6 illustrates the formation of under-bump metallurgy (UBM) layer 28, which may be blanket formed on passivation layer 24 and exposed TSVs 20, for example. UBM layer 28 may be formed using sputtering or other applicable methods. UBM layer 28 may include a barrier layer 28a and a seed layer 28b on barrier layer 28a. In some embodiments, barrier layer 28a includes a Ti layer, a Ta layer, a TiN layer, a TaN layer, or combinations thereof, although other materials may also be used. In some embodiments, the seed layer 28b includes copper.

Figure 7:
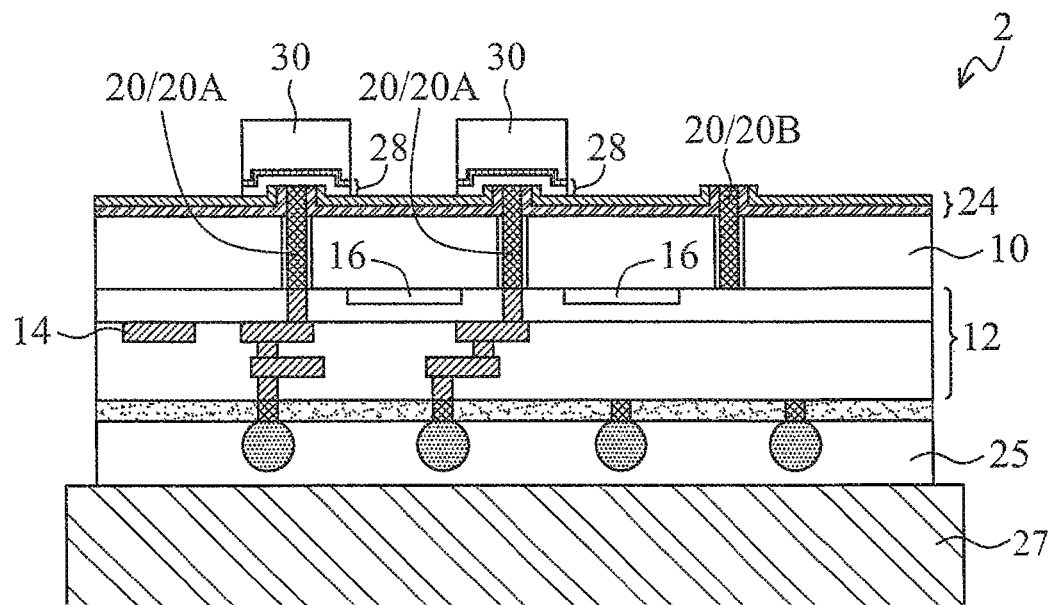

FIG. 7 illustrates the formation of exemplary backside features on the backside of wafer, wherein the backside features may include metal layers, metal bumps, passivation layers, micro bumps, and/or the like. In the exemplary embodiment as shown in FIG. 7, backside features 30 represent metal bumps and/or redistribution lines (RDLs). It is appreciated that although one layer of metal bumps/RDLs is shown, there may be one or more layer of RDLs, and metal bumps over and connected to the RDLs. In an exemplary embodiment, the formation of features 30 includes forming a mask (not shown) over UBM layer 28, with a portion of UBM layer 28 exposed through openings in the mask. A plating is then performed to plate a conductive material into the openings to form backside features 30. The mask is then removed, and the portions of the UBM layer 28 previously covered by the mask are etched. Alignment-mark TSVs 20B are also exposed, and may be used for the alignment in the formation of additional features such as RDLs and/or metal bumps over backside features 30.

FIGS. 9A through 9G illustrate top views of exemplary alignment marks 32, each formed of a plurality of alignment-mark TSVs 20B. When the plurality of alignment-mark TSVs 20B are grouped to form alignment mark 32, the plurality of alignment-mark TSVs 20B may be arranged in an rectangular region (also marked as 32) having length L and width W, wherein the rectangular region may be free from functional TSVs. Length L and width W may be between about 50 μm and about 400 μm, and may be between about 100 μm and about 200 μm. Accordingly, the rectangular region may have a top-view area smaller than about 400 μm×400 μm, or less than about 200 μm×200 μm.

Figure 9A:
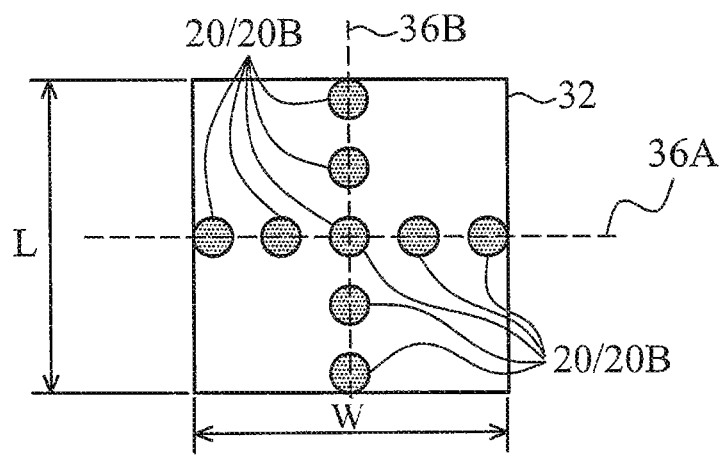
FIGS. 9A through 9G illustrate various alignment marks formed of through-substrate vias (TSVs)
Figure 9B:
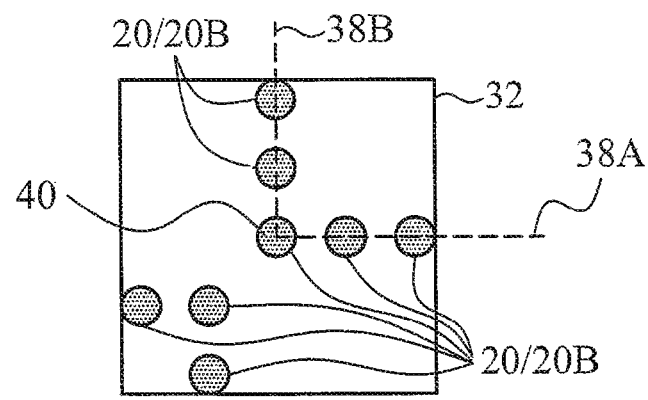
Figure 9C:
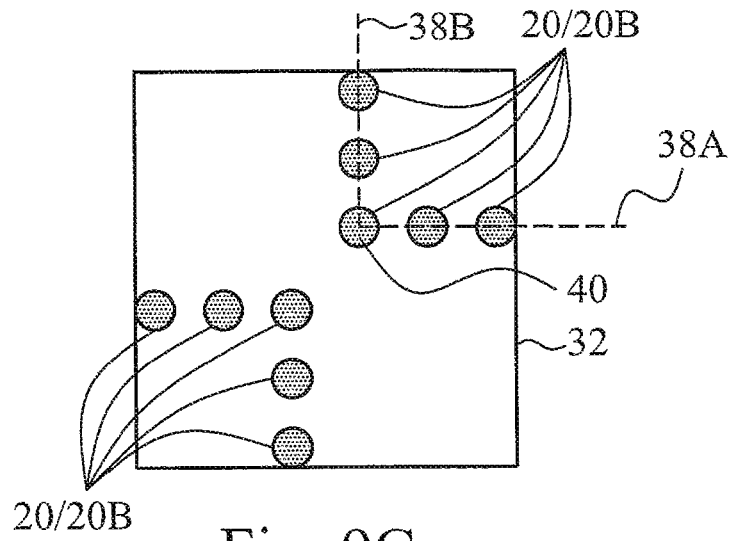
Figure 9D:
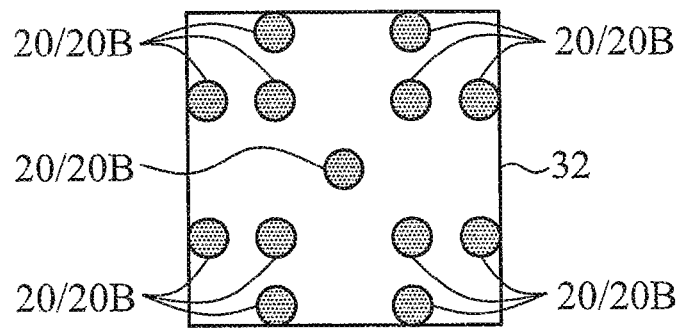
Figure 9E:
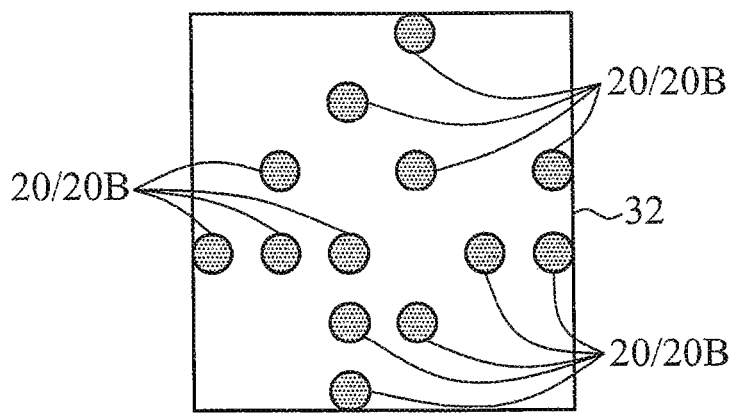
Figure 9F:
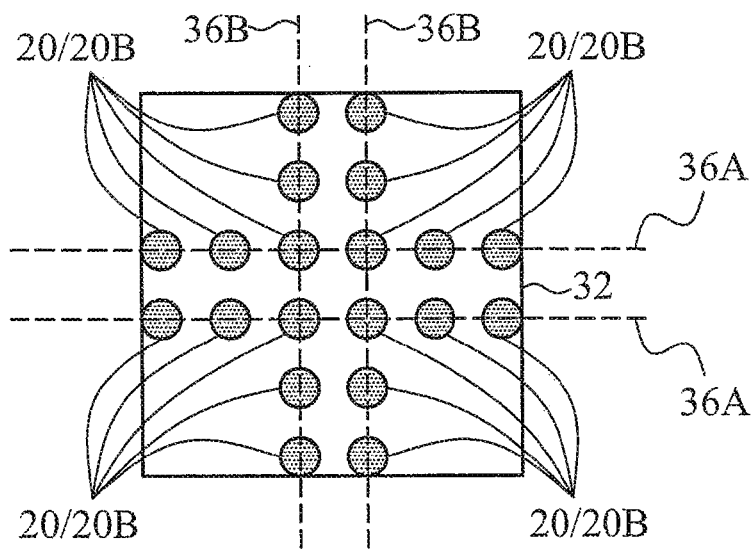
Figure 9G:
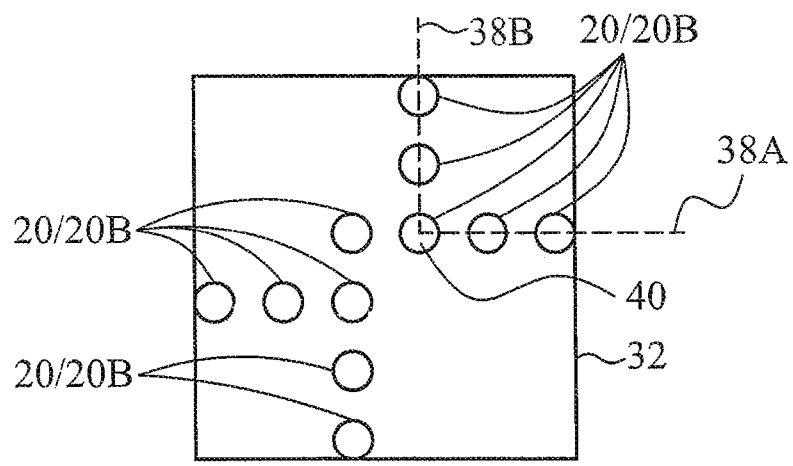

In FIGS. 9A through 9G, alignment-mark TSVs 20B may be arranged as different patterns. For example, in FIGS. 9A and 9F, alignment-mark TSVs 20B are aligned to lines 36A and 36B that cross each other. In FIGS. 9B, 9C, and 9G, alignment-mark TSVs 20B are aligned to lines 38A and 38B that terminate at common points 40. FIGS. 9D and 9E illustrate other exemplary patterns.

Figure 10:
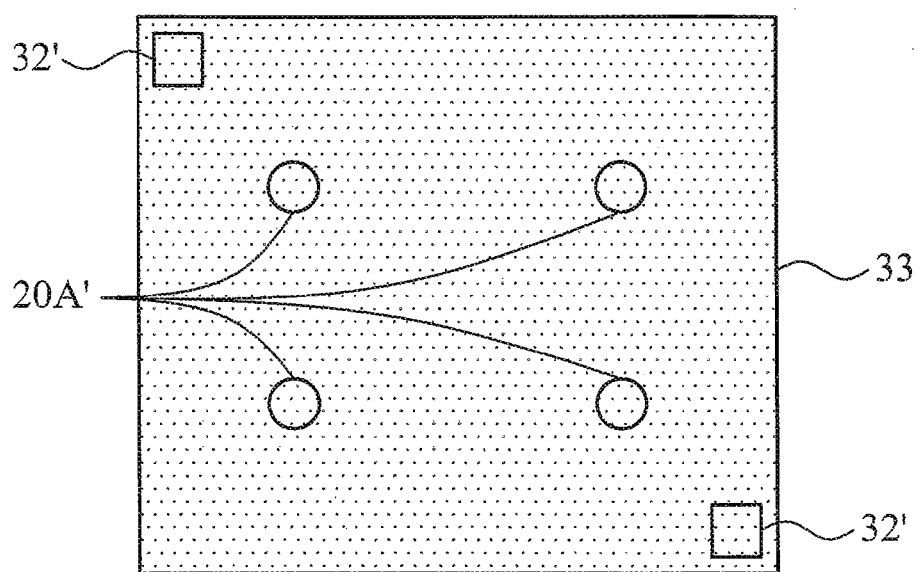
FIG. 10 illustrates a lithography mask for forming the TSVs.
Figure 11A:
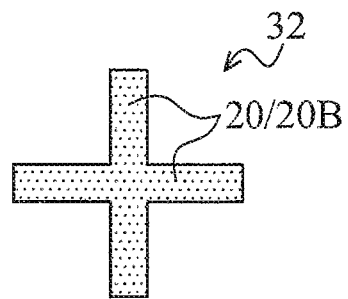
FIGS. 11A through 11D illustrate various alignment marks formed of trench-type TSVs.
Figure 11B:
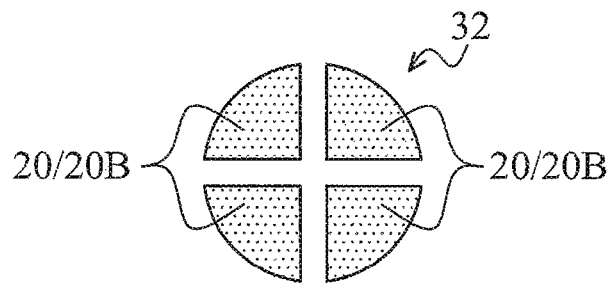
Figure 11C:
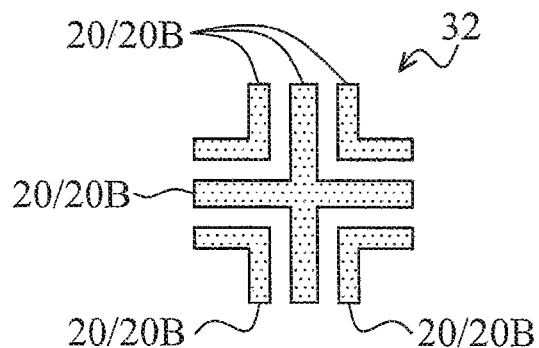
Figure 11D:
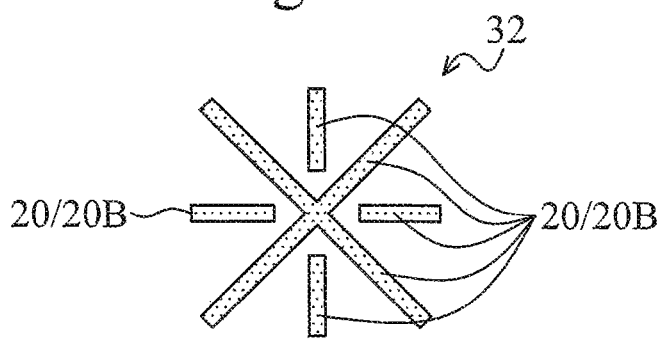

FIG. 10 illustrates an exemplary lithography mask 33 for forming TSVs 20, wherein alignment mark patterns 32' are formed in lithography mask 33 along with patterns 20A' for forming functional TSVs 20. Alignment-mark patterns 32' define the patterns of alignment-mark TSVs 20B, while patterns 20A' define the patterns of functional TSVs 20A.

FIGS. 11A through 11D illustrate alternative embodiments in which alignment marks 32 are formed of trench-type TSVs 20B, which, instead of having circular top-view shapes, may have other shapes including, but are not limited to, rectangles, crosses, and combinations thereof. Trench-type TSVs 20B may be formed at the same time as, or at different times than, forming functional TSVs 20A. Similarly, trench-type TSVs 20B also penetrate through substrate 10.

By using the embodiments, alignment marks may be formed at the same time functional TSVs are formed. Therefore, the cost incurred in conventional alignment-mark formation processes, including forming a photo resist for defining the patterns of backside alignment marks on the backside of wafer 2, etching wafer 2 for forming the backside alignment marks, and stripping off the photo resist is saved. Further, the accuracy for forming the alignment marks is improved. In conventional alignment mark formation techniques, the misalignment may be as great as about 2 μm. While in the embodiments, the misalignment is reduced to less than 1 μm.

In an embodiment, a device includes: a substrate having a first surface and a second surface opposite the first surface; an interconnect adjacent the first surface of the substrate; a plurality of conductive features adjacent the second surface of the substrate; a plurality of first through-substrate vias (TSVs) extending from the first surface of the substrate to the second surface of the substrate, the first TSVs electrically connecting the conductive features to the interconnect; and a first alignment mark including a plurality of second TSVs extending from the first surface of the substrate to the second surface of the substrate, the second TSVs being electrically isolated from the conductive features and the interconnect, the second TSVs being disposed in an alignment mark region of the substrate, the alignment mark region being free from the first TSVs.

In some embodiments of the device, the alignment mark region of the substrate has a length of between about 50 μm and about 400 μm, and the alignment mark region of the substrate has a width of between about 50 μm and about 400 μm. In some embodiments of the device, a first subset of the second TSVs are disposed along a first axis, and a second subset of the second TSVs are disposed along a second axis, the first axis and the second axis being parallel to the second surface of the substrate. In some embodiments of the device, the first axis intersects the second axis at first point disposed at a center of the alignment mark region. In some embodiments of the device, the first axis intersects the second axis at a first point disposed offset from a center of the alignment mark region. In some embodiments of the device, the interconnect includes a second alignment mark, the second alignment mark being aligned to the first alignment mark. In some embodiments of the device, the first TSVs and the second TSVs have the same top-view shape. In some embodiments of the device, the first TSVs and the second TSVs have different top-view shapes. In some embodiments of the device, the first TSVs and the second TSVs have the same width. In some embodiments of the device, the first TSVs and the second TSVs have the same height. In some embodiments of the device, the substrate is free from active devices.

In an embodiment, a device includes: a substrate having a first surface and a second surface opposite the first surface; an interconnect on the first surface of the substrate, the interconnect including conductive features disposed in dielectric layers; a passivation layer on the second surface of the substrate; a first through-substrate via (TSV) extending through the passivation layer and the substrate, the first TSV being electrically connected to the conductive features of the interconnect; a redistribution line (RDL) on the passivation layer and the first TSV, the RDL being electrically connected to the first TSV; and a second TSV extending through the passivation layer and the substrate, the second TSV being electrically isolated from the RDL and the conductive features of the interconnect.

In some embodiments of the device, the second TSV has a first end contacting one of the dielectric layers of the interconnect. In some embodiments of the device, the passivation layer has an opening exposing a second end of the second TSV. In some embodiments of the device, the first TSV and the second TSV extend through the passivation layer and the substrate by the same distance. In some embodiments of the device, the substrate is free from active devices.

In an embodiment, a device includes: a substrate having a first region and a second region; an interconnect on a first surface of the substrate; a passivation layer on a second surface of the substrate; a plurality of first through-substrate vias (TSVs) extending through the passivation layer and the first region of the substrate, the second region of the substrate being free from the first TSVs, the first TSVs being electrically connected to the interconnect; and a plurality of second TSVs extending through the passivation layer and the second region of the substrate, the first region of the substrate being free from the second TSVs, the second TSVs being electrically isolated from the interconnect.

In some embodiments, the device further includes: a plurality of conductive features on the first TSVs, the first TSVs being electrically connected to the conductive features, the second TSVs being electrically isolated from the conductive features. In some embodiments of the device, the first TSVs and the second TSVs extend through the passivation layer and the substrate by the same distance. In some embodiments of the device, the substrate is free from active devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first through-substrate via (TSV) and a second TSV in a substrate, wherein the forming of the first TSV and the second TSV comprises a photolithography process that simultaneously defines patterns for the first TSV and the second TSV using a single lithography mask;
   forming an interconnect structure on a front side of the substrate, wherein the interconnect structure comprises:
      a first alignment mark aligned to the second TSV; and
      a first conductive feature disposed in a dielectric layer;
   reducing a thickness of a back side of the substrate such that the first TSV and the second TSV protrude beyond the back side of the substrate; and
   forming a second conductive feature on the back side of the substrate, the second conductive feature being electrically connected to the first conductive feature through the first TSV, the second TSV being isolated from circuitry of the interconnect structure.

2. The method of claim 1, wherein the second TSV is used as a second alignment mark for positioning the second conductive feature.

3. The method of claim 1, wherein the first alignment mark is formed in a first-level metal layer of the interconnect structure.

4. The method of claim 1, wherein the first alignment mark is formed in a metal layer of the interconnect structure.

5. The method of claim 1 further comprising forming an active or a passive device on the front side of the substrate.

6. The method of claim 1 further comprising after reducing the thickness of the back side of the substrate, forming a passivation layer over the back side of the substrate and protruding portions of the first TSV and the second TSV.

7. The method of claim 6 further comprising etching the passivation layer to expose ends of the first TSV and the second TSV.

8. The method of claim 1, wherein the second TSV comprises forming the second TSV having a top-view shape of a cross, rectangle, or combination thereof.

9. The method of claim 1, wherein forming the first TSV and the second TSV comprises forming the second TSV having a different diameter than the first TSV.

10. The method of claim 1, wherein forming the first TSV and the second TSV comprises the first TSV and the second TSV extending through the substrate by the same distance.

11. A method comprising:
   depositing a first dielectric layer over a front side of a substrate;
   forming a plurality of first through-substrate vias (TSVs) and a plurality of second TSVs in the first dielectric layer and the substrate, wherein the forming of the plurality of first and second TSVs comprises simultaneously patterning openings for the plurality of first TSVs and second TSVs using a single lithography mask;
   forming an interconnect structure over the first dielectric layer;
   grinding a back side of the substrate to expose the plurality of first TSVs and the plurality of second TSVs; and
   forming conductive features on the back side of the substrate, wherein each of the conductive features is electrically coupled to the interconnect structure through a corresponding one of the plurality of first TSVs, and wherein each of the plurality of second TSVs is electrically isolated from the conductive features and the interconnect structure.

12. The method of claim 11, further comprising positioning the conductive features using the plurality of second TSVs as an alignment mark.

13. The method of claim 11, wherein first ones of the plurality of second TSVs are disposed along a first axis, second ones of the plurality of second TSVs are disposed along a second axis, wherein the first axis and the second axis are parallel to the back side of the substrate.

14. The method of claim 11, wherein the conductive features comprise a redistribution line or a metal bump.

15. The method of claim 11, further comprising forming an active device on the front side of the substrate.

16. The method of claim 11 further comprising forming metal bumps over the interconnect structure, wherein each of the metal bumps is electrically connected to a corresponding one of the conductive features.

17. A method comprising:
forming a functional through-substrate via (TSV) and an alignment TSV in a substrate;
forming an interconnect structure on a first surface of the substrate, wherein the interconnect structure comprises an alignment mark that is formed in a metal layer of the interconnect structure;
recessing a second surface of the substrate such that the functional TSV and the alignment TSV protrude beyond the second surface of the substrate;
forming a passivation layer over the second surface of the substrate, wherein the functional TSV and the alignment TSV extend through the passivation layer; and
forming a conductive feature on an opposite side of the substrate as the interconnect structure, the conductive feature electrically connected to the interconnect structure through the functional TSV, wherein forming the conductive feature comprises using a position of the alignment TSV as a reference.

18. The method of claim 17 wherein the alignment mark is aligned to the alignment TSV.

19. The method of claim 17, wherein recessing the second surface of the substrate comprises etching the second surface of the substrate.

20. The method of claim 17, wherein the functional TSV and the alignment TSV are formed simultaneously.

* * * * *